United States Patent [19]

Carbrey

[11] Patent Number: 4,651,134
[45] Date of Patent: Mar. 17, 1987

[54] SWITCHED CAPACITOR COUPLED LINE RECEIVER CIRCUIT

[75] Inventor: Robert L. Carbrey, Boulder, Colo.

[73] Assignees: American Telephone and Telegraph Company, New York, N.Y.; AT&T Information Systems Inc., Morristown, N.J.

[21] Appl. No.: 681,447

[22] Filed: Dec. 13, 1984

[51] Int. Cl.[4] .............................................. G06G 7/14
[52] U.S. Cl. ..................................... 340/425; 307/261; 307/352; 328/146; 379/338
[58] Field of Search ...... 179/16 AA, 170 NC, 170 R, 179/170 G, 18 AG, 18 AH, 18 FA, 18 FG, 18 FH, 78 R, 78 A, 79, 80; 328/146, 151; 307/261, 352, 353; 370/51, 52; 320/1; 358/147, 158

[56] References Cited

U.S. PATENT DOCUMENTS

| | | | |
|---|---|---|---|
| 4,012,645 | 3/1977 | Moorey | 307/293 |
| 4,039,979 | 8/1977 | Carbrey | 333/70 A |
| 4,137,464 | 1/1979 | Heller et al. | 307/227 |
| 4,295,105 | 10/1981 | Bingham | 332/9 R |
| 4,301,501 | 11/1981 | Carter et al. | 363/62 |
| 4,308,468 | 12/1981 | Olson | 307/353 |
| 4,322,697 | 3/1982 | Carbrey | 333/173 |
| 4,458,112 | 7/1984 | Svala | 179/18 FA |
| 4,484,089 | 11/1984 | Viswanathan | 307/297 |
| 4,523,107 | 6/1985 | Peterson | 307/352 |
| 4,560,890 | 12/1985 | Masuda et al. | 307/355 |

FOREIGN PATENT DOCUMENTS 27-7709  3/1952  Japan ................................... 307/353

Primary Examiner—Gene Z. Rubinson
Assistant Examiner—R. Vaas
Attorney, Agent, or Firm—John A. Caccuro

[57] ABSTRACT

A receiver circuit uses a switched capacitor circuit to couple either analog or digital signals received over a two lead communication facility to connected apparatus. During a first time interval, a capacitor is connected across a lead of a facility to sample the facility voltage. During a second time interval, this capacitor is disconnected from that lead and reconnected in series between the second facility lead and the input to a voltage regenerator circuit. An appropriate regenerator circuit is selected to reconstruct either the received analog or digital signals for output to connected apparatus.

4 Claims, 3 Drawing Figures

SWITCHED CAPACITOR COUPLED LINE RECEIVER CIRCUIT

TECHNICAL FIELD

This invention relates to a circuit for interfacing a communication line to a switching system and more particularly to a line interface circuit using switched capacitor coupling.

BACKGROUND OF THE INVENTION

Telephone switching systems typically use an analog port circuit to connect to the communication line. Many telephone switching systems now employ a digital port circuit to connect to the communication line from each digital terminal. This permits switching of digitized analog data and digital data. Since large switching systems can interface many terminals, the cost of these digital port circuits can become an appreciable percentage of the cost of the system. The receiver circuit part of the port circuit includes a bulky bifilar wound line transformer to provide dc isolation and longitudinal suppression. This transformer is expensive compared to the cost of other components of the circuit. Additionally, the physical size of this transformer affects the number of components which can be placed on a port board, the spacing between boards and hence affects the physical size of the system. What is desired is a port circuit design which is smaller and more cost effective.

SUMMARY OF THE INVENTION

In accordance with the present invention a switched capacitor circuit is used to provide the functions previously provided by a transformer in the receiver circuit of prior art port circuits. More particularly, during a first time interval a capacitor is charged to the voltage difference between one lead of a communication facility and a first reference voltage. During a predetermined second time interval the prior capacitor connections are removed and the capacitor connected between a second lead of the communication facility and an input to a voltage regenerator circuit. The voltage regenerator circuit regenerates the received line voltage for output to connected apparatus. In one embodiment, the voltage regenerator circuit includes a second capacitor having one terminal connected to a second reference voltage and a second lead thereof alternately switched between the regenerator circuit input terminals during the first and second time intervals. In another embodiment, the regenerator circuit includes a difference amplifier with a capacitor selectively connected in series therewith. In yet another embodiment, the received signal is a digital signal and the regenerator circuit includes a slicer circuit.

BRIEF DESCRIPTION OF THE DRAWING

The detailed description of the invention will be more fully appreciated from the illustrative embodiment shown in the drawing, in which.

DETAILED DESCRIPTION

This application is filed concurrently with my U.S. patent application Ser. No. 681,484, filed on Dec. 13, 1984 which is directed to another design of a switched capacitor coupled line receiver circuit.

Figure 1:
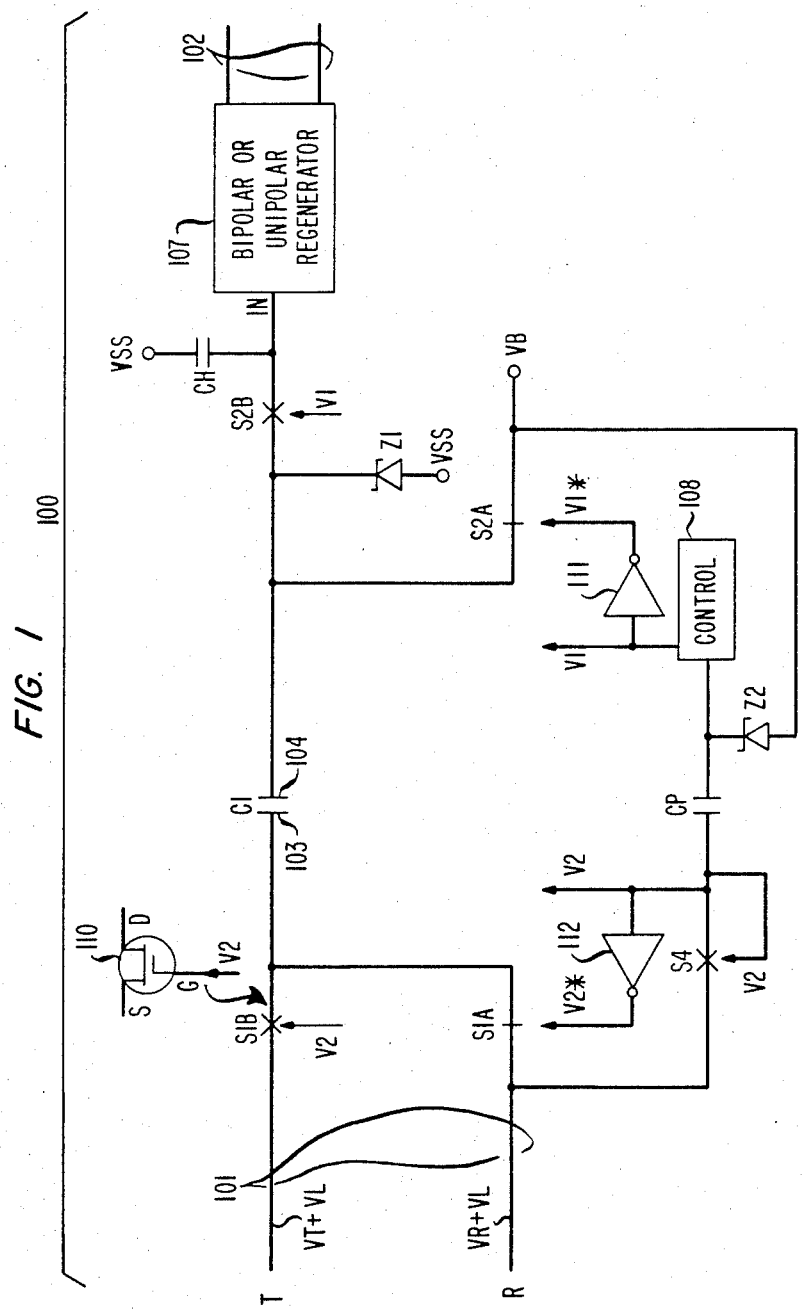
FIG. 1 illustrates a first embodiment of the present invention for receiving digital signals.
Figure 2:
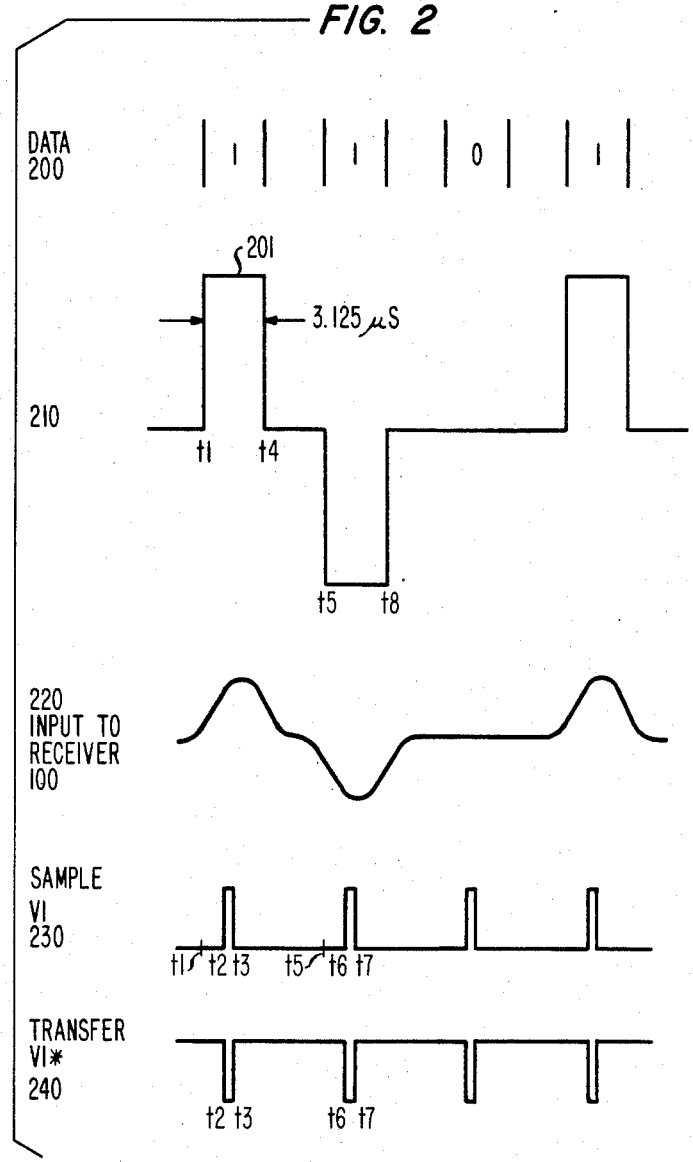
FIG. 2 shows typical digital voltage wave form received over the communication facility.

Shown in FIG. 1 is a first illustrative embodiment of the present invention as used in a digital signal receiver circuit 100. Digital signals received over the tip (T) and ring (R) leads of facility 101 are coupled via receiver 100 to communication apparatus connected to facility 102. Shown in FIG. 2 is the timing diagram for an illustrative application of the present invention where facility 101 carries bipolar signals at 160 kilobits per second (Kb/s). In bipolar data transmission logical 1 bits are transmitted alternately as positive (e.g., 201) and negative (e.g., 203) 3 volt pulses that are 3.125 microseconds ($\mu$s) wide followed by a 3.125 $\mu$s zero volt space (e.g., 202). Thus, a data sequence such as 200 would be transmitted as shown by 210. The logic 1 voltage pulses become attenuated and spread out as the signal travels along facility 101 and appear as pulse stream 220 at the line receiver 100 location. Receiver 100 receives these bipolar pulses and reconstructs the data (200) and the clock signal from the received pulse stream (220). Note, when unipolar data pulses are sent over a facility, each logic 1 pulse can be twice the amplitude (6 volts versus 3 volts) of a bipolar pulse sent over the same facility.

Returning to FIG. 1, there is shown the details of a switched capacitor coupled line circuit according to the present invention for use in a unipolar or bipolar digital signal receiver. Capacitor C1 is a line capacitor which is switched by switches S1A and S2A in series between lead R and voltage source VB. With joint reference to FIGS. 1 and 2, switches S1A and S2A operate in response to control signal V2* and V1*, respectively.

Control signal V2* is generated by inverting control signal V2, using inverter 112. Similarly, control signal V1* is generated by inverting control signal V1, using inverter 111. Control signals V2 and V2* are the same as signals V1 and V1* except that the dc reference for each is different, hence, the need for capacitor CP. Note, just as capacitor C1 isolates the T and R lead dc voltage from the rest of the receiver circuitry 100, capacitor CP isolates these dc voltages from control circuit 108. Switch S4 connects the input of inverter 112 to the R lead during signal V2.

Control circuit 108 generates control voltage V1 in a well known manner. Since receiver circuit 100 is used with digital signals, control circuit 108 generates signal V1 in phase with the incoming digital signal, illustratively, shown as 220 in FIG. 2. It is a well known characteristic of balanced transmission lines such as 101 that the voltage on the tip side of the line is equal and opposite in polarity to the voltage on the ring lead R. The difference voltage between tip and ring is the transverse voltage $VTR \leq (VT - VR)$ comprising the wanted signal. This is represented by waveform 220 of FIG. 2. Longitudinal voltages VL are, by definition, identical on both the tip and ring leads, T and R. The transverse component of the voltage $-VTR/2$ on the R lead is a mirror image of the component $+VTR/2$ on lead T. As illustrated by control voltages V1 and V2 of the sample interval or state (230), control circuit 108 generates control signal V1, during the most open part of the eye pattern of the received signal 220. The most open part of the eye pattern occurring when signal 220 is most positive (t2) and most negative (t6). Hence, control signal V1 appears as shown in 230. Illustratively, as will be discussed later, control signals V1, V2 are logic 1 for about 1 μsec and at logic 0 for about 5.25 μsec. Hence, the inverse signals V1* and V2* are at logic 1 for 5.25 μsec and at logic 0 for 1 μsec.

Capacitor C1 is connected in series with lead R and voltage source VB for 5.25 μsec (t1−t2) by switches S1A and S2A. Consequently, capacitor C1 samples the voltage on lead R and charges to a voltage of approximately VR+VL−VB. Where VR is the transverse voltage component −VTR/2 and VL is the longitudinal component of the voltage on the R lead. At time t2, when control signal V1 goes to logic 0 and control signal V1* goes to logic 1, switches S1A and S2A open and switches S1B and S2B close. The result is that capacitor C1 is connected in series between lead T and the input to bipolar regenerator 107. Obviously, if the received signal 220 is a unipolar signal, a unipolar regenerator 107 is used.

When terminal 103 of capacitor C1 is connected to lead R, it charges to the R lead voltage VR+VL, where VR is VTR/2, the other half of the transverse component. When capacitor C1 is switched to the T lead, it combines instantaneously the R lead voltage VR+VL with the T lead voltage. The result is that the voltage on capacitor C1 switches by the amount of the transverse voltage VT−VR to the T lead voltage VT+VL. The transverse voltage, i.e., the voltage on the T lead minus the voltage on the R lead, is equal to (VT+VL)−(VR+VL)=VT−VR. Since terminal 103 of capacitor C1 changes by a voltage VT−VR, the voltage on terminal 105 of capacitor C1 changes an equal amount. Thus, the voltage on terminal 104 changes from voltage VB to voltage VB+(VT−VR).

Note, since the longitudinal voltage VL is present equally on both the R and L leads, it does not affect the voltage coupled by capacitor C1. Illustratively, if capacitor C1 is N times the size of capacitor CH, then the resulting voltage VH on terminal 105 is VH=N/(N+1)[VB+(VT−VR)] or essentially VB+(VT−VR). Since VB is the voltage necessary to bias bipolar regenerator 107, essentially all of the differential voltage VT−VR is applied to regenerator 107. Regenerator 107 may be a slicer circuit which regenerates the original digital signal from the received output signal. The output of regenerator 107 is applied to facility 102 which may connect, for example, to a telephone switching system.

In addition to the T to R lead differential voltages, the circuitry of FIG. 1 must be able to withstand the high voltages due to lightning induced longitudinals as well as accidental power line crosses. Zeners Z1 and Z2 provide protection to the circuitry of FIG. 1. Zener Z1 shunts to bias voltage supply VB any excessive voltages coupled by capacitor C1 (by charging high voltage capacitor C1 to hold terminal 104 to the range sent by Zener Z1), thereby protecting switches S2A, S2B, capacitor CH and regenerator circuit 107. Zener Z2 shunts to bias voltage supply VB any excessive voltages on the R lead coupled by capacitor CP thereby protecting control circuit 108. Note, these Zener diodes also protect the receiver circuitry from static charge during manufacturing and handling.

Control circuit 108 generates pulsed switch control signals V1, V2, of FIG. 2, representing the time interval for capacitor C1 to sample the incoming T/R signals. Control signals V1*, V2*, represent the time interval for capacitor C1 to transfer the T/R signals to the regenerator circuit 107. Signal V1* is generated by inverting V1 through inverter 111 while V2* is generated using inverter 112. Signals V2 and V2* are signals V1 and V1* level shifted by the voltage on capacitor CP. Control circuit 108 generates these pulses in a well known manner. For example, pulse voltages V1, V2, are generated in circuit 108 in synchronism with the bit rate clock. This clock may be recovered from the transmitted data stream in a well known manner. Alternatively, the bit rate clock may be used to time control circuit 108.

Since receiver circuit 100 is used with digital signals, control circuit 108 signals V1 and V1* are phased with the incoming signal, illustratively shown as 220 in FIG. 2. More particularly, at approximately the most open part of the received data "eye pattern", when signal 220 is most positive or negative, (e.g., t2 or t6) control circuit 108 terminates the sample state causing pulses V1 and V2 to end and pulses V1* and V2* to begin.

Switches S1A, S1B, S2A and S2B may be implemented using well known N type metal oxide semiconductor (NMOS), P type (PMOS) or complementary (CMOS) type field effect transistors (FETs) or transmission gates as they are sometimes referred to. This type of switch is illustrated by 110 in FIG. 1 and includes source S, drain D and gate G. As illustrated, switch S1A operates under control of signal V2*, switch S1B under control of V2, switch S2A under control of V1* and switch S2B under control of V1. As shown, these signals V1, V1*, V2, V2* are applied to the gate terminal G of the associated switch. Obviously, switches S1A, S1B, S2A and S2B can be implemented using any well-known devices which can be made to open and close connections in response to control signals. Regenerator 107 may be implemented as a pair of monostable or bistable devices, one device which detects positive pulses and one device which detects negative pulses. These devices are appropriately biased to make the decision whether the received data is a logic 0 or logic 1. For the present embodiment an appropriately biased pair of bistable devices such as a D flip-flop (not shown) may be used with the D leads connected to capacitor CH and CLK leads connected to lead V1. One D-type flip-flop is used to detect positive logic 1 signals and the other is used to detect negative logic 1 signals and neither D-type flip-flop being set indicates a logic 0 signal. Note, if a unipolar output is desired for facility 102 a standard bipolar to unipolar converter circuit is used. Similarly, if the input signal on the T/R leads is a unipolar signal then one D-type flip-flop is used as unipolar regenerator 107 in a manner equivalent to that described above.

Figure 3:
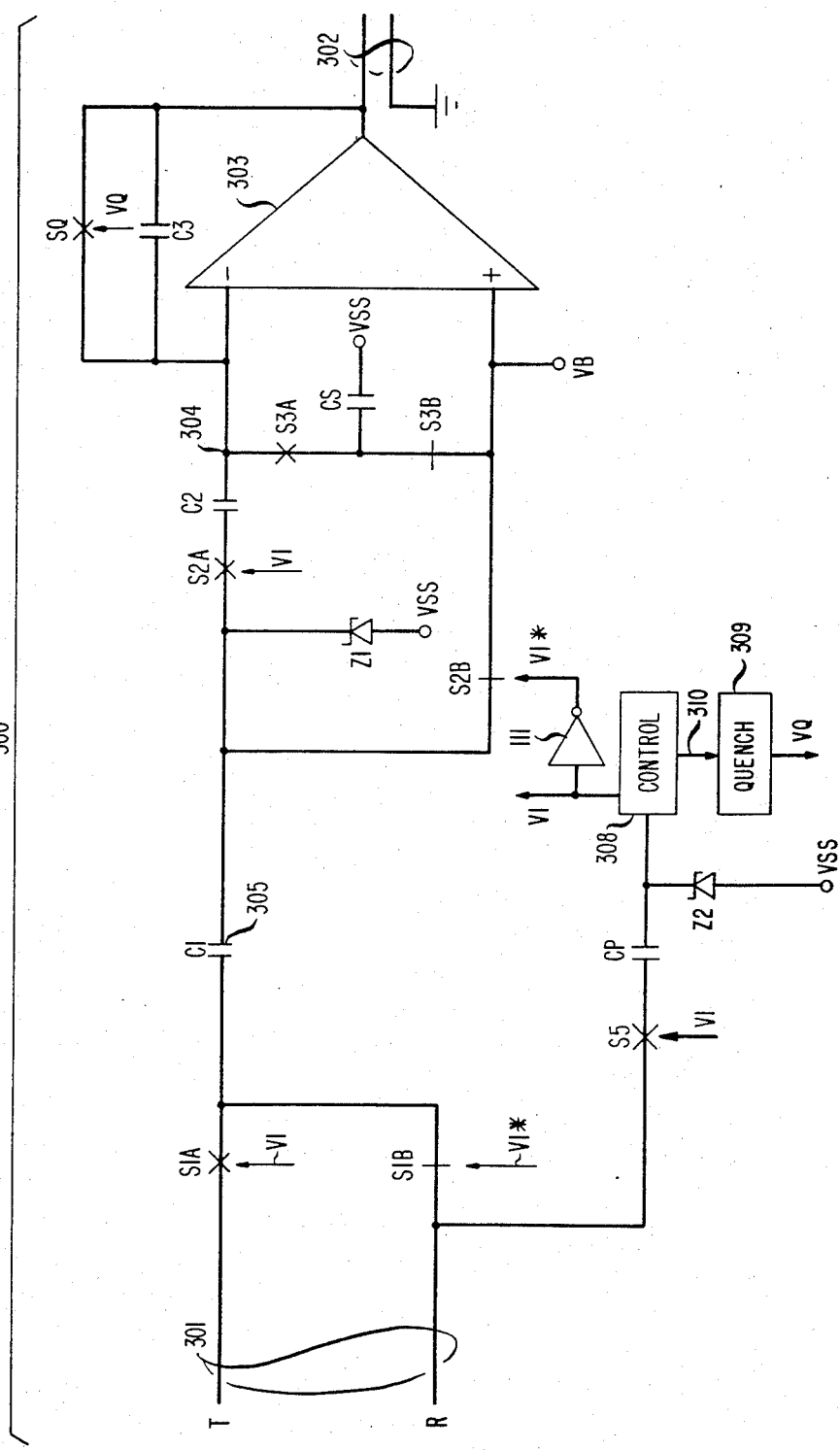
FIG. 3 shows a second embodiment of the present invention for receiving analog signals.

With reference to FIG. 3, a second embodiment of the present invention is illustrated. FIG. 3 shows an embodiment which may be used for analog signals received over facility 301. The function of line receiver 300 is to reconstruct the received analog signal and output it to circuitry connected via facility 302 which may include an antialiasing filter. Capacitor C1 operates under control of switches S1A, S2A, S1B and S2B as previously described. Switches S1A, S1B, S2A and S2B are implemented as described in FIG. 1. As previously described, control circuit 308 generates control signals V1 and V1* which control these switches. Since the incoming signal is an analog signal control circuit could generate V1 and V1* at the Nyquist rate (typically 8 KHz for speech). Note, the Nyquist rate is slightly greater than twice the highest frequency in the wanted pass band. However, it is desirable to sample at some rate n time greater than this. Such oversampling allows the resulting output filter to be the input to a switched capacitor antialiasing filter. Some forms of such a filter are shown in my U.S. Pat. Nos. 3,934,097, issued on June 1, 1976, and 4,322,697, issued on Jan. 26, 1982. The repetition rate for signal V1 is n times the analog sampling rate. If n=16, for example, there would be 16×8,000=128,000 switching pulse cycles per second generated by control circuit 308.

During signal voltage V1, capacitor C1 is charged to the difference between the R lead voltage and VB. After switches S1B and S2B open and switches S1A and S2A close both the left and right sides of capacitor C1 rise by the transverse voltage VT−VR. As described previously for FIG. 1, since longitudinal voltage on leads R and T are equal, they do not affect the voltage coupled by capacitor C1. Note, however, any unbalance in the longitudinal voltage V1 would appear as part of the transverse voltage VT−VR.

The transverse voltage coupled by capacitor C1 is outputted to operational amplifier 303 via series capacitor C2. Capacitors C2, C3 and operational amplifier 303 form a voltage amplifier which amplifies the voltage outputted by capacitor C1. Operational amplifier feedback principles require that the voltage at the minus (−) input of amplifier 303 remain fixed at its virtual ground voltage. In this case, that voltage is bias voltage VB. As a result, if the left terminal of capacitor C2 rises, the output of amplifier 303 must fall enough to prevent its (−) input terminal voltage from changing. This is accomplished because the charge flowing into the junction 304 via capacitor C2 is just canceled by a corresponding charge flowing out of that junction via capacitor C3.

If capacitors C2 and C3 are equal, with adequate open circuit gain, of course, the output of amplifier 303 is equal and opposite to the change of input voltage to capacitor C2. Thus, the effective gain of amplifier 303 is proportional to the ratio of capacitor C2 to C3. Since capacitors C1 and C2 are in series; what has been said with regard to capacitor C2 really applies to the series combination of capacitances C1 and C2. Thus, capacitor C2 could be eliminated. It is, however, very difficult to scale the capacity of an external discrete capacitor C1 to give the desired gain. Therefore, capacitor C1 is made large with respect to the on-chip capacitor C2, and thus, the small capacitor C2 dominates the gain ratio. It is worth noting, however, that the gain of amplifier 303 can be controlled to some extent by capacitor C1 if it is also small. Moreover, gain adjustments could be made internally by providing on-chip capacitors which can be electronically switched in parallel with either capacitor C2 and C3.

In a similar manner to that described in FIG. 1, Zener diodes Z1 and Z2 provide surge voltage protection for receiver circuit 300.

Capacitor CS is used to eliminate any dc offset voltage between the negative (−) and positive (+) inputs of amplifier 303. Thus, the output of amplifier 303 does not include any dc offset. Note, if a dc offset voltage is to be outputted as part of the signal, then capacitor C3 and switches S3A and S3B can be eliminated.

During the sample state, switch S3B is closed and capacitor CS is connected to the positive input and is charged to voltage VB. During the transfer state, switch S3B opens and switch S3A closes. Consequently, capacitor CS is connected to the negative input of amplifier 303 and applies its charge or voltage thereat. As a result of the operation of capacitor CS, the voltage on the negative and positive input of amplifier 303 is equalized to about voltage VB. This combination acts as a low frequency cutoff high pass filter.

Capacitor C3 has a switch SQ connected across it for shorting capacitor C3 in response to control signal VQ from quench circuit 309. During the reception of analog signals, amplifier 303 integrates the analog signal samples obtained by capacitor C1. Shorting or discharging of capacitor C3 at the analog signal sample frequency rate enables the integration process to start again resulting in better filtering action. Signal VQ is generated by quench circuit in a well-known manner using the sample frequency clock signal 310 received from control circuit 308. Switch S5 connects control circuit 308 via capacitor CP to R lead during signal V1.

It is anticipated that many other well-known circuits can be utilized to implement some or all of the circuitry and functions of the present invention. While the present memory circuit invention is implemented using N- or P-type metal oxide semiconductor technology, it is anticipated that other embodiments can be implemented using any of the well-known discrete, hybrid or integrated circuit techniques. Additionally, the timing of various control pulses shown herein are illustrative and the timing can be changed to suit the particular application. Thus, what has been disclosed is merely illustrative of the present invention and other arrangements can be implemented by those skilled in the art without departing from the spirit and scope of the present invention. Although a balanced pair input line 101 or 301 has been illustrated herein, the same principles apply to inputs with one lead fixed (at ground typically) such as coaxial cable.

What is claimed is:

1. A circuit for receiving signals from a two-lead facility said circuit comprising
   a capacitor,
   means for connecting said capacitor between a first lead of said facility and a reference voltage for sampling the voltage from said first lead during a first time interval;
   second means for connecting said capacitor between a second lead of said facility and an intermediate terminal of said circuit for sampling the voltage on said second lead during a second time interval;
   a voltage regenerator circuit connected to said intermediate terminal during said second time interval for generating a circuit output signal representing a differential voltage across said facility;
   wherein said voltage regenerator circuit includes a difference amplifier having a first input terminal connected to said reference voltage and a second input terminal connected to said intermediate terminal during said second time interval; and
   wherein said voltage regenerator circuit further includes a second capacitor selectively connected between said first input terminal and a second reference voltage during said first time interval and connected between said second input terminal and said second reference voltage during said second time interval.

2. The receiving circuit of claim 1 wherein said voltage regenerator circuit further includes a third capacitor connected in a feedback path between an output and said second input of said difference amplifier and further including means for shorting said third capacitor in response to a control signal.

3. A circuit for receiving signals from a two-lead facility said circuit comprising
- a capacitor,
- means for connecting said capacitor between a first lead of said facility and a reference voltage for sampling the voltage from said first lead during a first time interval;
- second means for connecting said capacitor between a second lead of said facility and an intermediate terminal of said circuit for sampling the voltage on said second lead during a second time interval;
- a voltage regenerator circuit connected to said intermediate terminal during said second time interval for generating a circuit output signal representing a differential voltage across said facility;
- wherein said voltage regenerator circuit includes a difference amplifier having a first input terminal connected to said reference voltage and a second input terminal connected to said intermediate terminal during said second time interval; and
- a coupling capacitor connected in series between said second input of said difference amplifier and said intermediate terminal.

4. A circuit for receiving signals from a two-lead facility said circuit comprising
- a capacitor,
- means for connecting said capacitor between a first lead of said facility and a reference voltage for sampling the voltage from said first lead during a first time interval;
- second means for connecting said capacitor between a second lead of said facility and an intermediate terminal of said circuit for sampling the voltage on said second lead during a second time interval;
- a voltage regenerator circuit connected to said intermediate terminal during said second time interval for generating a circuit output signal representing a differential voltage across said facility; and
- wherein the voltage across said facility is a digital signal and wherein said regenerator circuit includes a slicer circuit for regenerating said voltage across said facility.

* * * * *